US012658218B2

(12) United States Patent
Lee

(10) Patent No.: US 12,658,218 B2
(45) Date of Patent: Jun. 16, 2026

(54) SEMICONDUCTOR DEVICE WITH SOURCE AND DRAIN PADS LOCATED ON THE SAME SIDE OF A BLOCK WORD LINE AND CONNECTED TO A U-SHAPED CHANNEL LAYER LOCATED THEREIN

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 528 days.

(21) Appl. No.: 18/348,959

(22) Filed: Jul. 7, 2023

(65) Prior Publication Data

US 2024/0331738 A1 Oct. 3, 2024

(30) Foreign Application Priority Data

Mar. 29, 2023 (KR) ........................ 10-2023-0041015

(51) Int. Cl.
*G11C 5/06* (2006.01)
*H10B 43/10* (2023.01)
*H10B 43/27* (2023.01)
*H10B 43/30* (2023.01)
*H10B 43/40* (2023.01)

(52) U.S. Cl.
CPC ............. *G11C 5/063* (2013.01); *H10B 43/10* (2023.02); *H10B 43/27* (2023.02); *H10B 43/30* (2023.02); *H10B 43/40* (2023.02)

(58) Field of Classification Search
CPC ........ G11C 5/063; H10B 43/10; H10B 43/27; H10B 43/30; H10B 43/40; H10B 43/50; H10B 41/27; H10B 41/30; H10B 41/40; H10B 41/10; H10B 41/50
See application file for complete search history.

(56) References Cited

U.S. PATENT DOCUMENTS

2019/0043872 A1* 2/2019 Oh ...................... G11C 16/0483
2022/0093621 A1* 3/2022 Lee ........................ H10B 63/34

FOREIGN PATENT DOCUMENTS

KR 100753106 B1 8/2007
KR 1020220037282 A 3/2022

* cited by examiner

*Primary Examiner* — Davienne N Monbleau
*Assistant Examiner* — John Patrick Cornely
(74) *Attorney, Agent, or Firm* — WILLIAM PARK AND ASSOCIATES LTD.

(57) ABSTRACT

A semiconductor device including a first block word line, and a first channel layer located in the first block word line. the semiconductor device including a source pad connected to the first channel layer and located on the first block word line, and a first drain pad connected to the first channel layer and located on the first block word line. The semiconductor device including a global word line connected to the source pad, and a first local word line connected to the first drain pad.

15 Claims, 22 Drawing Sheets

A-A'

B-B'

LWL2
7A
7B  } IC1
7A
IL1
DPD2
5A2
4A2
3A2
BWL2

PTR2

C-C'

D-D'

E-E'

F-F'

SEMICONDUCTOR DEVICE WITH SOURCE AND DRAIN PADS LOCATED ON THE SAME SIDE OF A BLOCK WORD LINE AND CONNECTED TO A U-SHAPED CHANNEL LAYER LOCATED THEREIN

CROSS-REFERENCE TO RELATED APPLICATION

This application claims priority under 35 U.S.C. § 119(a) to Korean Patent Application No. 10-2023-0041015 filed on Mar. 29, 2023, in the Korean Intellectual Property Office, which is incorporated herein by reference in its entirety.

BACKGROUND

1. Technical Field

Embodiments of the present disclosure generally relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include: a first block word line; a first channel layer located in the first block word line; a source pad connected to the first channel layer and located on the first block word line; a first drain pad connected to the first channel layer and located on the first block word line; a global word line connected to the source pad; and a first local word line connected to the first drain pad.

In an embodiment, a semiconductor device may include: a gate structure including stacked gate lines; a first block word line located below the gate structure; a global word line located between the first block word line and the gate structure; local word lines located between the first block word line and the gate structure; pass transistors connected between the global word line and the local word lines and including a channel layer having substantially a U shape and located in the block word line; and an interconnection structure connecting the local word lines and the gate lines, respectively.

In an embodiment, a manufacturing method of a semiconductor device may include: forming a trench in the substrate; forming a gate insulating layer in the trench; forming a channel layer in the gate insulating layer; forming a source pad connected to the channel layer; forming a first drain pad connected to the channel layer; forming a global word line electrically connected to the source pad; and forming a first local word line electrically connected to the first drain pad.

In an embodiment, a manufacturing method of a semiconductor device may include: forming a pass transistor including a channel layer having substantially a U shape and located in a substrate; forming a global word line connected to the pass transistor; forming a local word line connected to the pass transistor; forming gate lines on the global word line and the local word line; and forming an interconnection structure connecting the local word line to each of the gate lines.

DETAILED DESCRIPTION

Various embodiments are directed to a semiconductor device having a stable structure and improved characteristics and a manufacturing method of the semiconductor device.

By stacking memory cells in three dimensions for some embodiments, it is possible to improve the degree of integration of a semiconductor device. It is also possible, in some embodiments, to provide a semiconductor device having a stable structure and improved reliability.

Hereafter, embodiments in accordance with the technical spirit of the present disclosure will be described with reference to the accompanying drawings. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. Like numerals refer to like elements throughout. In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

Figure 1:
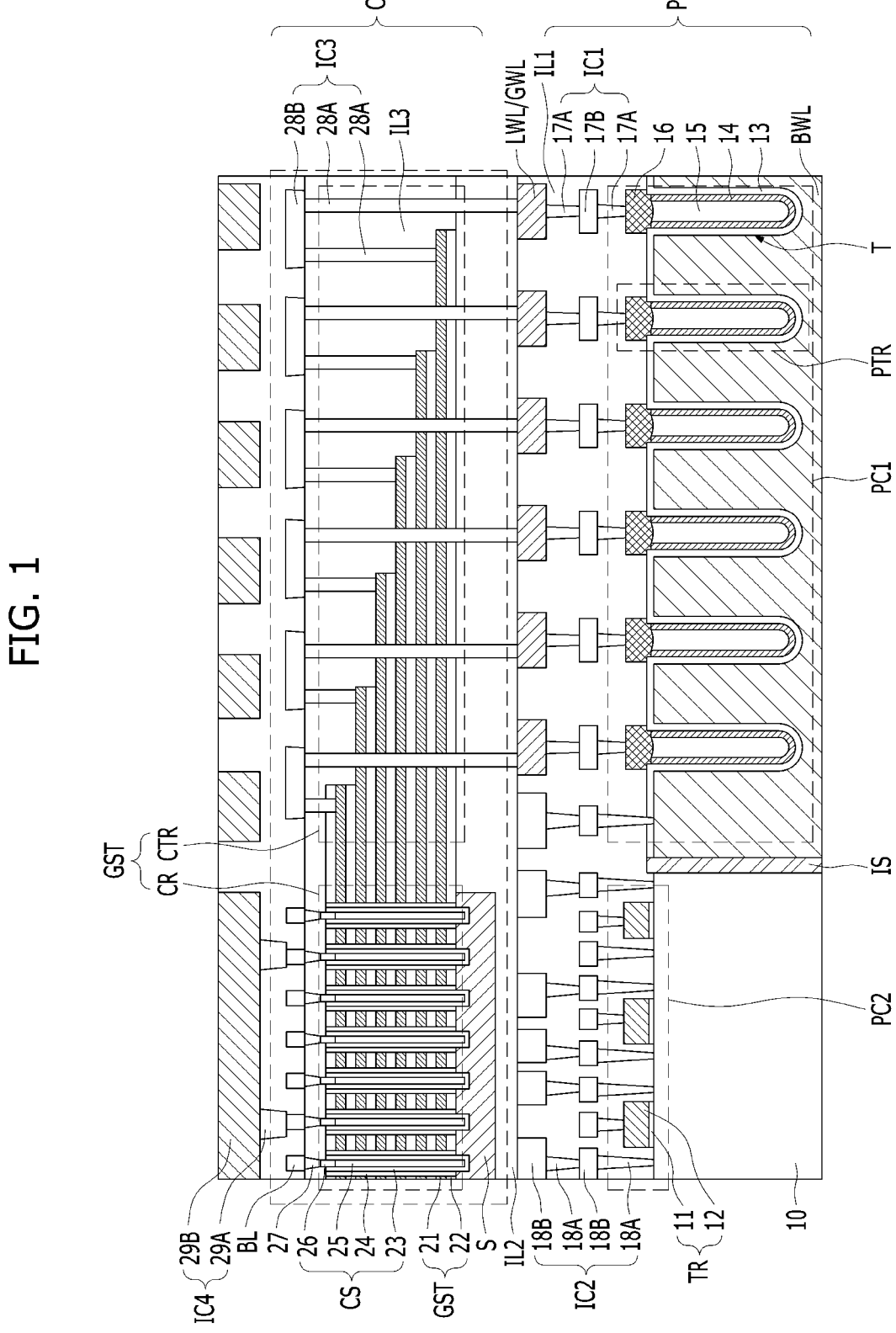
FIG. 1 is a diagram illustrating the structure of a semiconductor device in accordance with an embodiment.

FIG. 1 is a diagram illustrating the structure of a semiconductor device in accordance with an embodiment.

Referring to FIG. 1, the semiconductor device may include a cell array CA and a peripheral circuit PC. As an example, the cell array CA and the peripheral circuit PC may be included on the same wafer, and the cell array CA may be stacked on the peripheral circuit PC. As an example, the cell array CA and the peripheral circuit PC may be included on different wafers, and the semiconductor device may have a structure in which at least two wafers are bonded to each other.

The semiconductor device may include a block word line BWL, a pass transistor PTR, a local word line LWL, and a global word line GWL. The semiconductor device may further include a substrate 10, a gate structure GST, cell structures CS, an isolation structure IS, a source structure S, bit lines BL, a first interlayer dielectric layer IL1, a second interlayer dielectric layer IL2, a third interlayer dielectric layer IL3, a first interconnection structure IC1, a second interconnection structure IC2, a third interconnection structure IC3, or a fourth interconnection structure IC4, or a combination thereof.

The cell array CA may include the source structure S, the cell structures CS, the gate structure GST, vias 27, or bit lines BL, or a combination thereof. The gate structure GST may be located between the source structure S and the bit lines BL.

The gate structure GST may include a cell region CR and a contact region CTR. The gate structure GST may include stacked gate lines 21. As an example, the gate structure GST may include the gate lines 21 and insulating layers 22 that are alternately stacked. The gate lines 21 may be word lines or select lines.

The cell structures CS may be located in the cell region CR of the gate structure GST. The cell structures CS may extend through the gate lines 21. A memory cell or a select transistor may be located in a region where the cell structures CS and the gate lines 21 intersect each other. The cell structures CS may be connected between the source structure S and the bit lines BL. As an example, the cell structure CS and the bit line BL may be connected to each other through the via 27. The fourth interconnection structure IC4 may be connected to the bit line BL. The fourth interconnection structure IC4 may include at least one contact plug 29A or at least one wire line 29B, or a combination thereof.

The cell structure CS may include a channel layer 23. The cell structure CS may further include a memory layer 24, an insulating core 25, or a channel pad 26, or a combination thereof. The memory layer 24 may cover sidewalls of the channel layer 23. The memory layer 24 may include a tunneling layer, a data storage layer, or a blocking layer, or a combination thereof. The insulating core 25 may be located in the channel layer 23 and may include an insulating material such as oxide, nitride, or air gap. The channel pad 26 may be located on the insulating core 25, and may be directly connected to the channel layer 23. The channel pad 26 may include a junction doped with impurities.

Each of the gate lines 21 may be exposed in the contact region CTR of the gate structure GST. As an example, the contact region CTR of the gate structure GST may have a step shape. The third interconnection structure IC3 may be connected to the contact region CTR of the gate structure GST. The third interconnection structure IC3 may be used to transfer a bias to the gate lines 21. The third interconnection structure IC3 may include at least one contact plug 28A or at least one wire line 28B, or a combination thereof.

The peripheral circuit PC may include a first peripheral circuit PC1 and a second peripheral circuit PC2. The first peripheral circuit PC1 may be located below the contact region CTR. The first peripheral circuit PC1 may include a pass transistor PTR and a local word line LWL. The first peripheral circuit PC1 may further include a block word line BWL or a global word line GWL, or a combination thereof. As an example, the first peripheral circuit PC1 may include a row decoder.

The pass transistor PTR may be connected between the global word line GWL and the local word line LWL, and may be a switch that controls a connection between the global word line GWL and the local word line LWL. The pass transistor PTR may be a high-voltage NMOS transistor. The pass transistor PTR may include a channel layer 14 located in the block word line BWL. The channel layer 14 may have a U-shaped cross section. As an example, the block word line BWL may include a trench T, and the channel layer 14 may be located in the trench T.

The block word line BWL may be formed by doping impurities into the substrate 10. The impurity may include arsenic (As) or phosphorus (P). The pass transistor PTR may be located at a portion where the block word line BWL and the channel layer 14 intersect each other. A portion of the block word line BWL surrounding the channel layer 14 may be a gate electrode of the pass transistor PTR.

The pass transistor PTR may be turned on or off by a block control signal applied to the block word line BWL. The global word line GWL and the local word line LWL may be connected to each other by turning on the pass transistor PTR, and an operating voltage may be transferred from the global word line GWL to the local word line LWL. A connection between the global word line GWL and the local word line LWL may be blocked by turning off the pass transistor PTR.

The pass transistor PTR may further include a gate insulating layer 13, an insulating core 15, or a junction pad 16, or a combination thereof. The gate insulating layer 13 may be located between the channel layer 14 and the block word line BWL. As an example, the gate insulating layer 13 may extend along an inner surface of the trench and an upper surface of the block word line BWL. The gate insulating layer 13 may include an oxide layer, and the oxide layer may be formed by a deposition method or an oxidation method. The insulating core 15 may be located in the channel layer 14. The insulating core 15 may include an insulating material such as oxide, nitride, or air gap.

The junction pad 16 may be located on the insulating core 15, and may be connected to the channel layer 14. The junction pad 16 may be located on the block word line BWL. The junction pad 16 might not be located inside the block word line BWL, and may be located to protrude into the block word line BWL from the upper surface. The junction pad 16 may have a wider width than the channel layer 14. The junction pad 16 and the block word line BWL may be insulated by the gate insulating layer 13. The junction pad 16 may be a source pad including a source region or a drain pad including a drain region.

The first interconnection structure IC1 may be connected to the first peripheral circuit PC1. As an example, the first interconnection structure IC1 may be connected to the junction pad 16 of the pass transistor PTR. The first interconnection structure IC1 may be located in the first interlayer dielectric layer IL1, and may include at least one contact plug 17A and at least one wiring line 17B. The pass transistor PTR may be connected to the local word line LWL and the global word line GWL through the first interconnection structure IC1. As an example, the contact plug 17A may be connected to the junction pad 16.

The gate line 21 and the local word line LWL may be connected to each other through the third interconnection structure IC3. The contact plug 28A may extend through the gate lines 21, and may be electrically connected to the local word line LWL. As an example, the contact plug 28A may pass through the third interlayer dielectric layer IL3, the gate structure GST, and the second interlayer dielectric layer IL2, or pass through the third interlayer dielectric layer IL3 and the second interlayer dielectric layer IL2. The contact plug 28A may be insulated from the gate lines 21. Accordingly, the local word lines LWL may be connected to the gate lines 21 through the contact plugs 28A, respectively.

The second peripheral circuit PC2 may be located below the cell region CR. The second peripheral circuit PC2 may be located below the cell structures CS. The second peripheral circuit PC2 may include transistors TR located on the substrate 10. The transistor TR may include a gate insulating layer 11 and a gate electrode 12 located on the substrate 10, and may be a planar transistor. As an example, the second peripheral circuit PC2 may include a page buffer.

The second interconnection structure IC2 may be connected to the second peripheral circuit PC2. The second interconnection structure IC2 may include at least one contact plug 18A and at least one wire line 18B.

According to the structure described above, a part of the substrate 10 may be used as the block word line BWL, and the pass transistor PTR may be located in the block word line BWL. In an embodiment, because the channel layer 14 has a U-shaped cross section, an area occupied by the pass transistor PTR can be reduced. Furthermore, a width of the pass transistor PTR can be adjusted according to a depth of the trench T, and cell current can be increased by increasing the depth.

The first peripheral circuit PC1 and the second peripheral circuit PC2 may include different types of transistors. The first peripheral circuit PC1 may include the pass transistor PTR including the channel layer 14 having a U shape. The second peripheral circuit PC2 may include a planar transistor. By configuring, in an embodiment, the peripheral circuits PC1 and PC2 by combining a pass transistor with a relatively large channel width and a planar transistor with a relatively small channel width, areas occupied by the peripheral circuits PC1 and PC2 can be reduced.

Figure 2A:
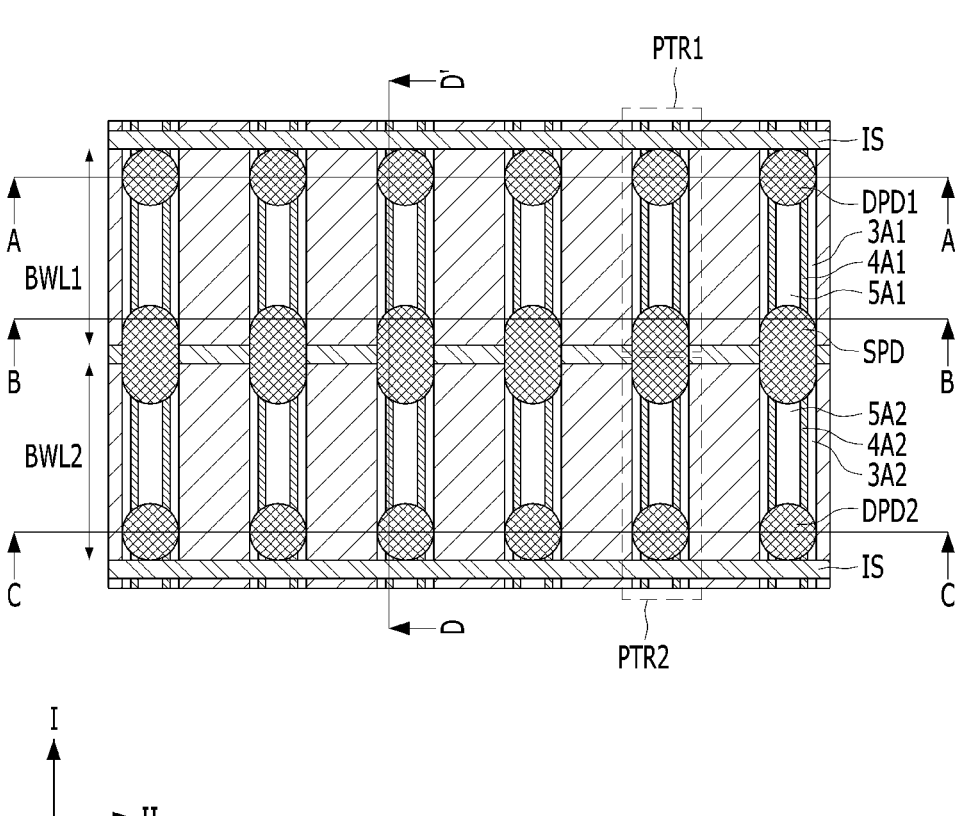
FIGS. 2A, 2B, 2C, 2D, and 2E are diagrams illustrating the structure of a semiconductor device in accordance with an embodiment.
Figure 2B:
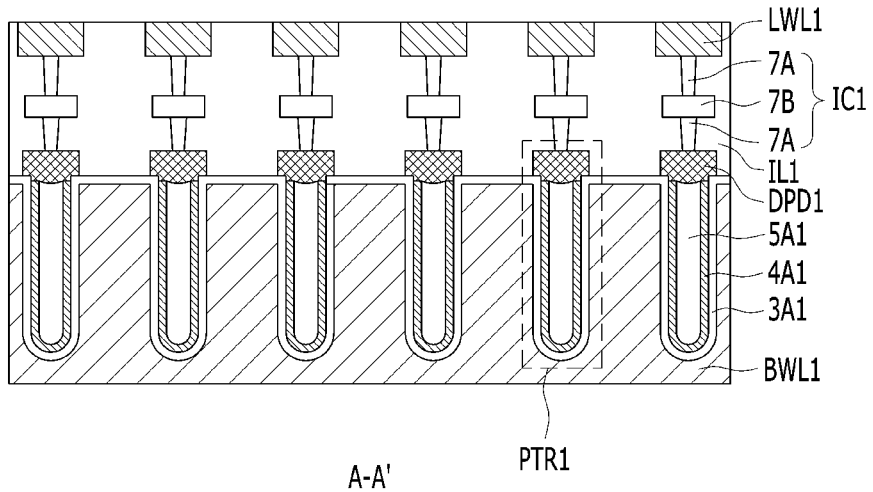
Figure 2C:
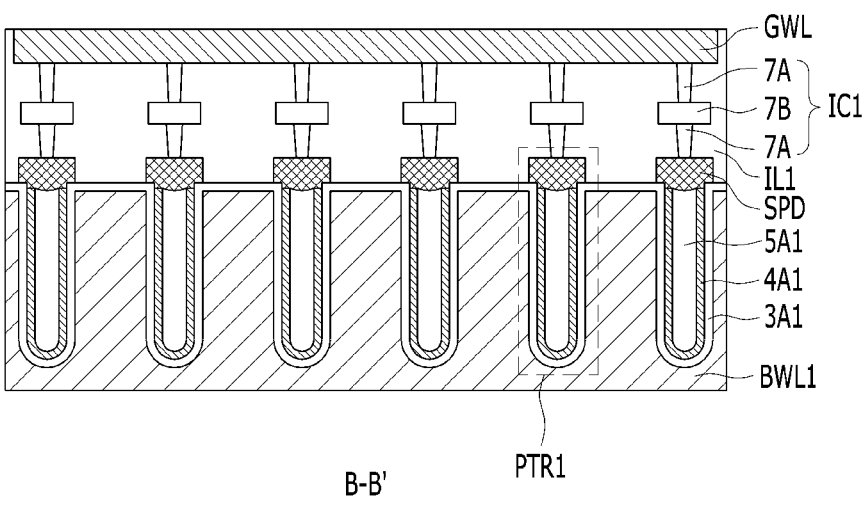
Figure 2D:
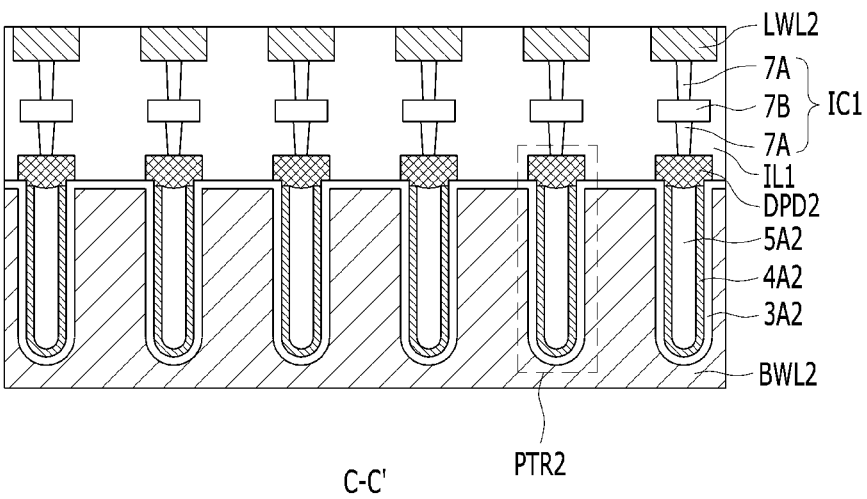
Figure 2E:
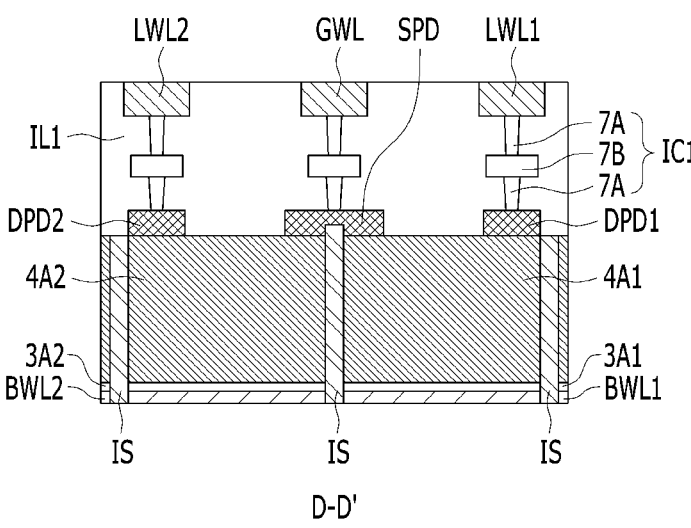

FIGS. 2A to 2E are diagrams illustrating the structure of a semiconductor device in accordance with an embodiment. FIG. 2A may be a layout, FIG. 2B may be a cross-sectional view taken along line A-A' in FIG. 2A, FIG. 2C may be a cross-sectional view taken along line B-B' in FIG. 2A, FIG. 2D may be a cross-sectional view taken along line C-C' in FIG. 2A, and FIG. 2E may be a cross-sectional view taken along line D-D' in FIG. 2A. Hereinafter, the content overlapping with the previously described content will be omitted.

Referring to FIGS. 2A to 2D, the semiconductor device may include a first block word line BWL1, first pass transistors PTR1, a global word line GWL, and first local word lines LWL1. The semiconductor device may further include a second block word line BWL2, second pass transistors PTR2, second local word lines LWL2, an isolation structure IS, and a first interconnection structure IC1, or a combination thereof. The first interconnection structure IC1 may include at least one contact plug 7A or at least one wire line 7B, or a combination thereof.

The first block word line BWL1 and the second block word line BWL2 may be adjacent to each other in a first direction I. The first block word line BWL1 and the second block word line BWL2 may extend in a second direction II intersecting the first direction I. The isolation structure IS may be located between the first block word line BWL1 and the second block word line BWL2. The isolation structure IS may extend in the second direction II. The first block word line BWL1 and the second block word line BWL2 may be insulated from each other by the isolation structure IS.

The first pass transistor PTR1 may include first channel layers 4A1, a first gate insulating layer 3A1, a first insulating core 5A1, a source pad SPD, and a first drain pad DPD1. A portion of the first block word line BWL1 surrounding the first channel layer 4A1 may be used as a gate electrode of the first pass transistor PTR1.

The second pass transistor PTR2 may include second channel layers 4A2, a second gate insulating layer 3A2, a second insulating core 5A2, a source pad SPD, and a second drain pad DPD2. A portion of the second block word line BWL2 surrounding the second channel layer 4A2 may be used as a gate electrode of the second pass transistor PTR2.

The first pass transistors PTR1 may be adjacent to each other in the first direction I. The second pass transistors PTR2 may be adjacent to each other in the second direction II. The first pass transistor PTR1 and the second pass transistor PTR2 may be adjacent to each other in the first direction I.

The first channel layer 4A1 may be located in the first block word line BWL1. The first channel layers 4A1 may be adjacent to each other in the second direction II, and may extend in the first direction I. The second channel layer 4A2 may be located in the second block word line BWL2. The second channel layers 4A2 may be adjacent to each other in the second direction II, and may extend in the first direction I. The first channel layer 4A1 and the second channel layer 4A2 may be adjacent to each other in the first direction I.

The first channel layer 4A1 may be connected to the first drain pad DPD1 and the source pad SPD. The first drain pad DPD1 may be connected to one end of the first channel layer 4A1, and the source pad SPD may be connected to the other end of the first channel layer 4A1. The second channel layer 4A2 may be connected to the second drain pad DPD2 and the source pad SPD. The second drain pad DPD2 may be connected to one end of the second channel layer 4A2, and the source pad SPD may be connected to the other end of the second channel layer 4A2.

The source pad SPD may be commonly connected to the first channel layer 4A1 and the second channel layer 4A2. The source pad SPD may have a wider width in the first direction I than the first drain pad DPD1 and the second drain pad DPD2. The source pad SPD may extend in the first direction I across the isolation structure IS.

The first pass transistor PTR1 may be connected to the first local word line LWL1 through the first drain pad DPD1, and may be connected to the global word line GWL through the source pad SPD. The second pass transistor PTR2 may be connected to the second local word line LWL2 through the second drain pad DPD2, and may be connected to the global word line GWL through the source pad SPD.

The first local word line LWL1 may be located on the first block word line BWL1. The first local word lines LWL1 may be arranged along the second direction II. The first local word lines LWL1 may be connected to the first drain pads DPD1, respectively. The second local word line LWL2 may be located on the second block word line BWL2. The second local word lines LWL2 may be arranged along the second direction II. The second local word lines LWL2 may be connected to the second drain pads DPD2, respectively.

The global word line GWL may be located on the isolation structure IS. The global word line GWL may be located between the first local word line LWL1 and the second local word line LWL2, and may extend along the second direction II. The global word line GWL may be commonly connected to the source pads SPD.

In the present embodiment, a case where the first pass transistor PTR1 and the second pass transistor PTR2 share the source pad SPD has been described; however, the first pass transistor PTR1 and the second pass transistor PTR2 may share the drain pad. As an example, the first pass transistor PTR1 may include a first source pad and the drain pad, and the second pass transistor PTR2 may include a second source pad and the drain pad. In such a case, the first pass transistor PTR1 and the second pass transistor PTR2 may share the drain pad. The first pass transistor PTR1 may be connected to the first local word line LWL1 through the first source pad and, may be connected to the global word line GWL through the drain pad. The second pass transistor PTR2 may be connected to the second local word line LWL2 through the second source pad, and may be connected to the global word line GWL through the drain pad.

According to the structure described above, the first pass transistors PTR1 connected to a first memory block can be commonly controlled by the first block word line BWL1. As an example, the first pass transistors PTR1 can be turned on by activating the first block word line BWL1, and the global word line GWL and the first local word lines LWL1 can be connected to each other. Through this, operating voltages such as a read voltage, a program voltage, and a pass voltage can be applied to gate lines belonging to the first memory block.

The second pass transistors PTR2 connected to the second memory block can be commonly controlled through the second block word line BWL2. As an example, the second pass transistors PTR2 can be turned on by activating the second block word line BWL2, and the global word line GWL and the second local word lines LWL2 can be connected to each other. Through this, operating voltages such as a read voltage, a program voltage, and a pass voltage can be applied to gate lines belonging to the second memory block.

Figure 3:
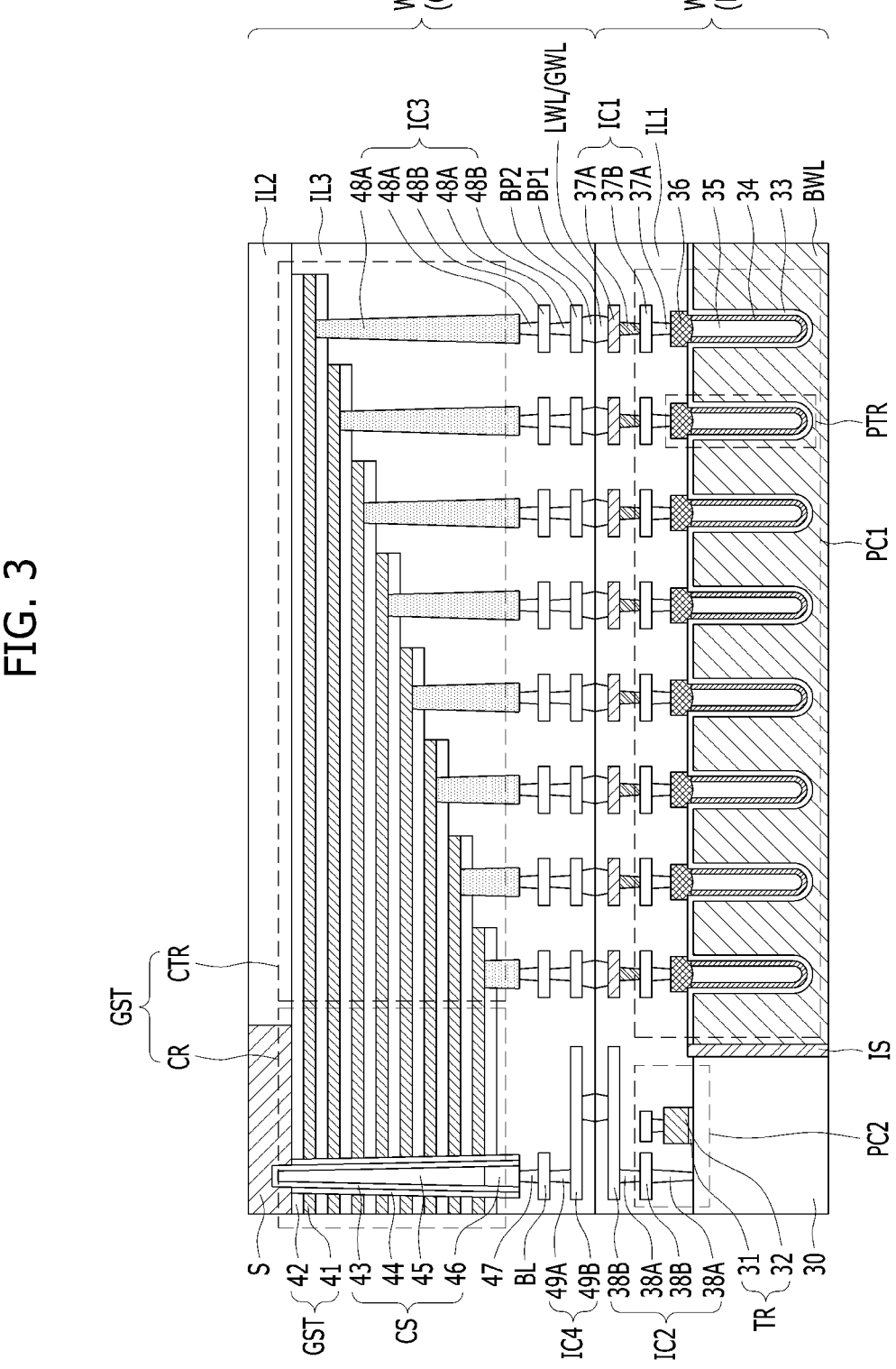
FIG. 3 is a diagram illustrating the structure of a semiconductor device in accordance with an embodiment.

FIG. 3 is a diagram illustrating the structure of a semiconductor device in accordance with an embodiment. Hereinafter, the content overlapping with the previously described content will be omitted.

Referring to FIG. 3, the semiconductor device may include a first wafer WF1 and a second wafer WF2. The first wafer WF1 may include a peripheral circuit PC, and the second wafer WF2 may include a cell array CA. The semiconductor device may have a structure in which the first wafer WF1 and the second wafer WF2 are bonded to each other.

The second wafer WF2 may further include a gate structure GST, cell structures CS, a source structure S, vias 47, bit lines BL, a second interlayer dielectric layer IL2, a third interlayer dielectric layer IL3, a third interconnection structure IC3, a second interconnection structure IC2, a fourth interconnection structure IC4, or a second bonding pad BP2, or a combination thereof.

The gate structure GST may include a cell region CR and a contact region CTR. The gate structure GST may include gate lines 41 and insulating layers 42 that are alternately stacked. The cell structure CS may include a channel layer 43, a memory layer 44, an insulating core 45, or a channel pad 46, or a combination thereof. The cell structures CS may extend through the gate lines 41, and may be connected between the source structure S and the bit lines BL. As an example, the cell structure CS and the bit line BL may be connected to each other through the via 47. The fourth interconnection structure IC4 may be connected to the bit line BL. The fourth interconnection structure IC4 may include at least one contact plug 49A or at least one wire line 49B, or a combination thereof.

Each of the gate lines 41 may be exposed in the contact region CTR of the gate structure GST. The third interconnection structure IC3 may be connected to the contact region CTR of the gate structure GST. The third interconnection structure IC3 may include at least one contact plug 48A or at least one wire line 48B, or a combination thereof.

The first wafer WF1 may further include a substrate 30, a block word line BWL, an isolation structure IS, a pass transistor PTR, a global word line GWL, a local word line LWL, a first interlayer dielectric layer IL1, a first interconnection structure IC1, the second interconnection structure IC2, or a first bonding pad BP1, or a combination thereof.

The peripheral circuit PC of the first wafer WF1 may include a first peripheral circuit PC1 and a second peripheral circuit PC2. The first peripheral circuit PC1 may include a row decoder and may be located to face the contact region CTR. The second peripheral circuit PC2 may include a page buffer and may be located to face the cell region CR. The pass transistor PTR of the first peripheral circuit PC1 may include a channel layer 34 having a U-shape and located in the block word line BWL. The pass transistor PTR may further include a gate insulating layer 33, an insulating core 35, or a junction pad 36, or a combination thereof. The transistor TR of the second peripheral circuit PC2 may include a gate insulating layer 31 and a gate electrode 32 located on the substrate 30.

The first interconnection structure IC1 may be connected to the first peripheral circuit PC1. The pass transistor PTR may be connected to the local word line LWL and the global word line GWL through the first interconnection structure IC1. The first interconnection structure IC1 may include at least one contact plug 37A and at least one wire line 37B. The second interconnection structure IC2 may be connected to the second peripheral circuit PC2. The second interconnection structure IC2 may include at least one contact plug 38A and at least one wire line 38B.

The first wafer WF1 and the second wafer WF2 may be electrically connected by the first bonding pad BP1 of the first wafer WF1 and the second bonding pad BP2 of the second wafer WF2. The first interconnection structure IC1 and the third interconnection structure IC3 may be electrically connected to each other through the first bonding pad BP1 and the second bonding pad BP2. The second interconnection structure IC2 and the fourth interconnection structure IC4 may be electrically connected to each other through the first bonding pad BP1 and the second bonding pad BP2. The first bonding pad BP1 and the second bonding pad BP2 may be copper pads, respectively.

According to the structure of an embodiment described above, the peripheral circuit PC and the cell array CA can be manufactured with different wafers. In an embodiment, the global word line GWL and the local word line LWL can be connected to each other through the pass transistor PTR, and the local word line LWL and the gate line 41 can be connected to each other through the bonding pads BP1 and BP2.

FIGS. 4A, 5A, 6A, 7A, and 8A, FIGS. 4B, 5B, 6B, 7B, and 8B, FIGS. 9A to 9C, and FIGS. 10 and 11 are diagrams for describing a manufacturing method of a semiconductor device in accordance with an embodiment. FIGS. 4A, 5A, 6A, 7A, 8A, and 9A may be layouts, FIGS. 4B, 5B, 6B, 7B, 8B, and 9B may be cross-sectional views taken along lines E-E' of FIGS. 4A, 5A, 6A, 7A, 8A, and 9A, and FIG. 9C may be a cross-sectional view taken along line F-F' of FIG. 9A.

Figure 4A:
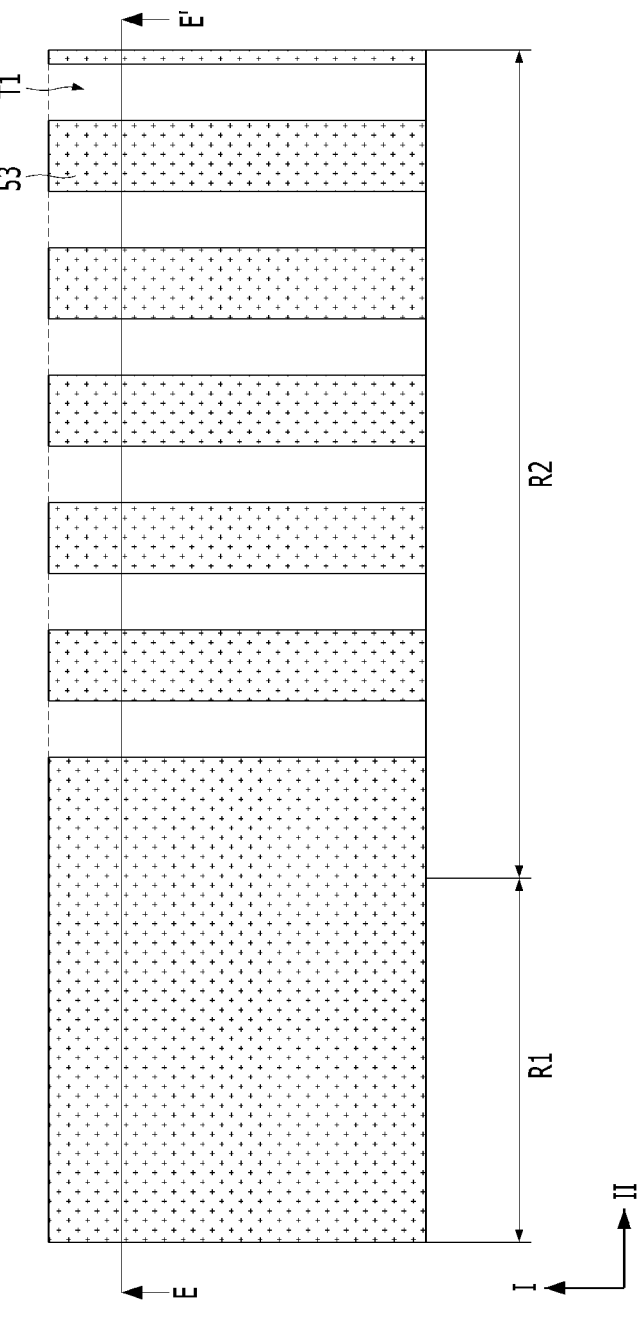
FIGS. 4A, 4B, 5A, 5B, 6A, 6B, 7A, 7B, 8A, 8B, 9A, 9B, 9C, 10, and 11 are diagrams for describing a manufacturing method of a semiconductor device in accordance with an embodiment.
Figure 4B:
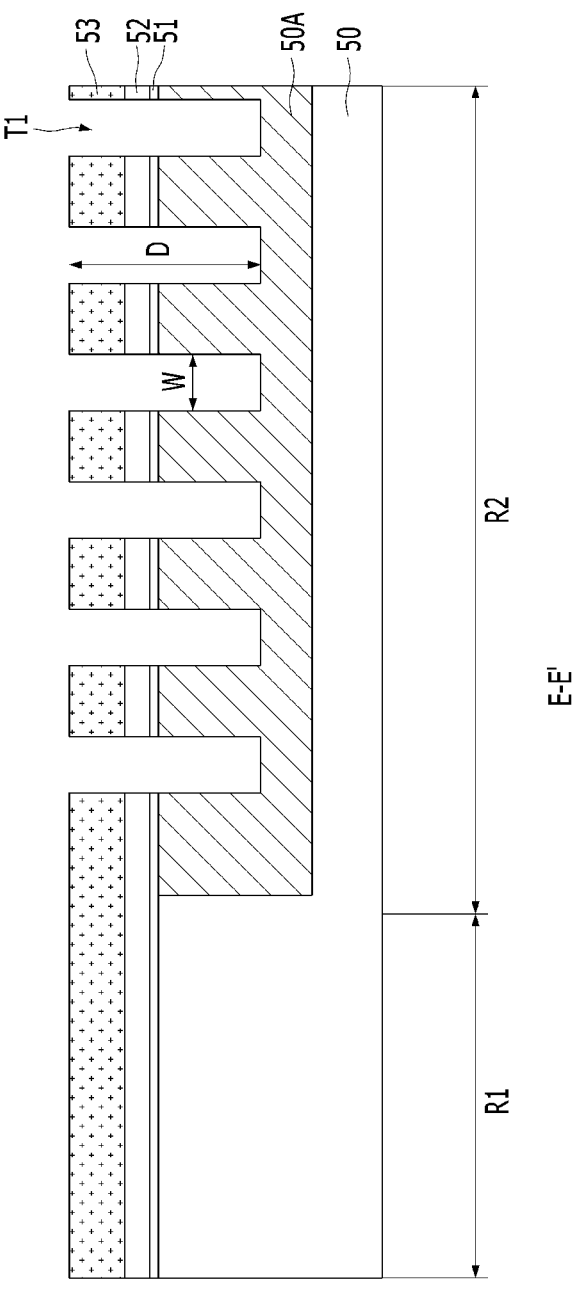

Referring to FIGS. 4A and 4B, a plurality of first trenches T1 may be formed in a substrate 50. The substrate 50 may include a first region R1 and a second region R2. The first region R1 may be a region where a first peripheral circuit is to be formed, and the second region R2 may be a region where a second peripheral circuit is to be formed. As an example, the first peripheral circuitry may include a page buffer, and the second peripheral circuitry may include a low-decoder.

As an example, a pad oxide layer 51 may be formed on the substrate 50 and a pad layer 52 may be formed on the pad oxide layer 51. The pad layer 52 may include nitride. Subsequently, a mask pattern 53 may be formed on the pad layer 52. As an example, the mask pattern 53 may include photoresist. Subsequently, the pad layer 52 and the pad oxide layer 51 may be etched using the mask pattern 53 as an etching barrier, and the substrate 50 may be partially etched to form the first trenches T.

The first trench T1 may be used to define a channel region of a pass transistor. The first trench T1 may be located in the second region R2 and may extend in a first direction I. The plurality of first trenches T1 may be adjacent to one another in a second direction II intersecting the first direction I. A width W and a depth D of the first trench T1 may be determined in consideration of characteristics of a pass transistor. When the depth D is large, the width of the pass transistor may be increased and cell current may be increased. The width W may be determined in consideration of thicknesses of a gate insulating layer, a channel layer, and the like, which are formed in a subsequent process.

Subsequently, a block word line 50A may be formed. Impurities may be doped into the substrate 50 through the first trench T1 to form a region having a lower specific resistance than the substrate 50. A region doped with impurities may serve as a block word line 50A. As an example, the block word line 50A may be formed by performing an implantation process in a tilt and/or twist method. Impurities may be implanted through the mask pattern 53. Subsequently, the mask pattern 53 may be removed and a cleaning process may be performed.

Figure 5A:
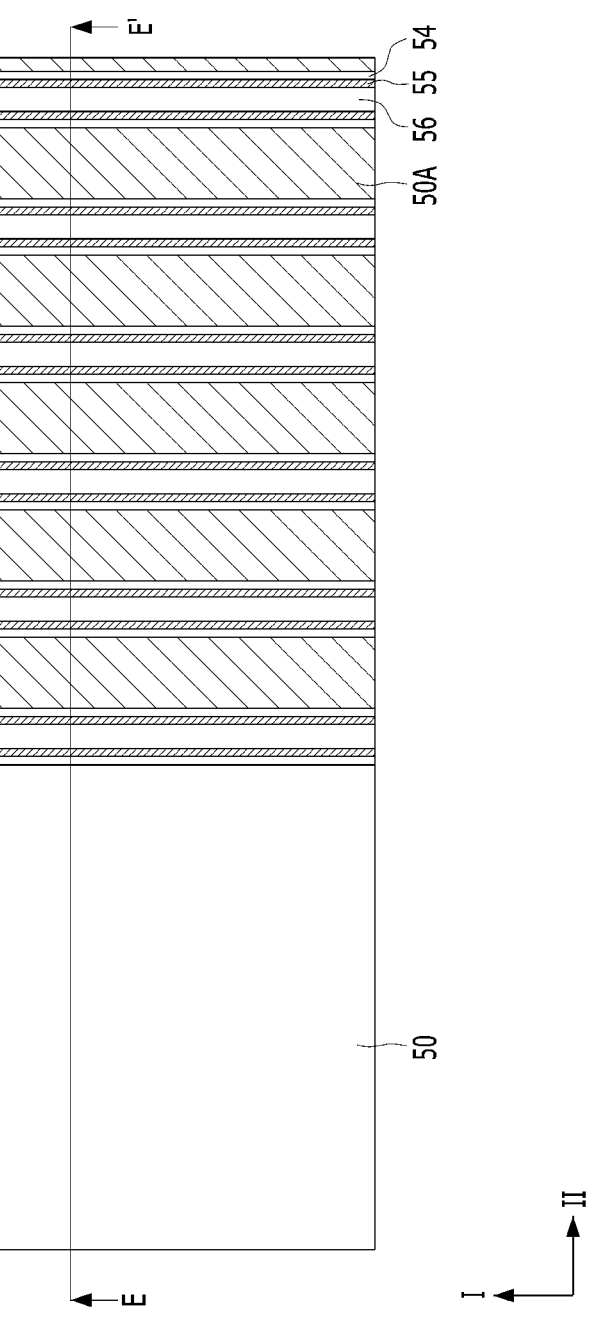
Figure 5B:
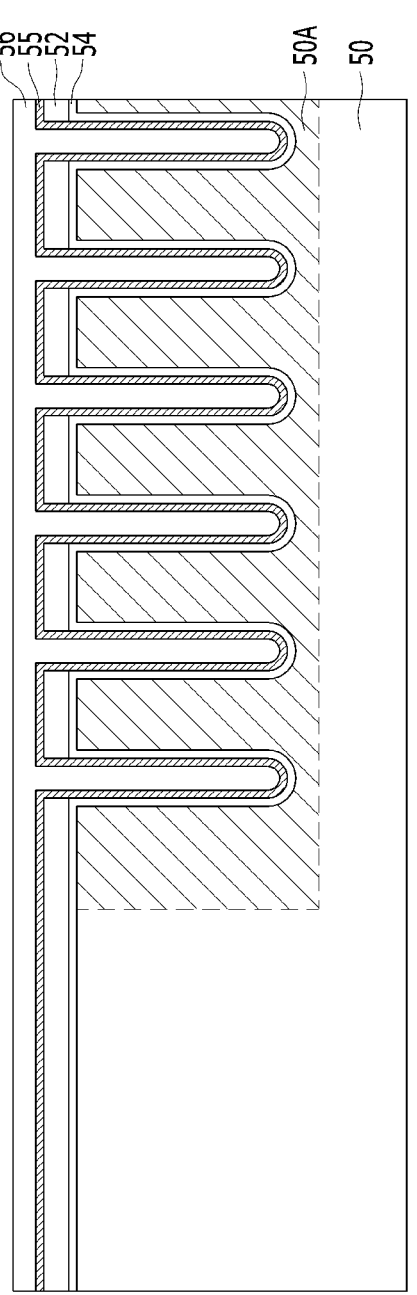

Referring to FIGS. 5A and 5B, a gate insulating layer 54 may be formed in the first trench T1. As an example, the gate insulating layer 54 may be formed using an oxidation process. An inner surface of the first trench T1 may be oxidized through the oxidation process, and the gate insulating layer 54 extending along the inner surface of the first trench T1 may be formed. During the oxidation process, an upper surface of the substrate 50 and/or the block word line 50A may be oxidized by a predetermined thickness, and the oxidized upper surface and the pad oxide layer 51 may be used as the gate insulating layer 54 together.

Subsequently, a channel layer 55 may be formed in the gate insulating layer 54. As an example, the channel layer 55 may be formed by performing a heat treatment process after a polysilicon layer is deposited. The channel layer 55 may be formed along a surface of the gate insulating layer 54. The channel layer 55 may be formed in the first trench T1 and may extend along a surface of a pad layer 52. Subsequently, an insulating core layer 56 may be formed in the channel layer 55. The insulating core layer 56 may fill the first trench

T1 and may be formed on the pad layer 52. The insulating core layer 56 may include an insulating material such as oxide, nitride, or air gap.

Impurities may be doped into the channel layer 55 in order to adjust a threshold voltage of the pass transistor. The impurity may include boron. As an example, a surface of the channel layer 55 may be doped with impurities by performing an implantation process in a tilt and/or twist method. The impurity doping may be performed before the insulating core layer 56 is formed or after the insulating core layer 56 is formed.

Figure 6A:
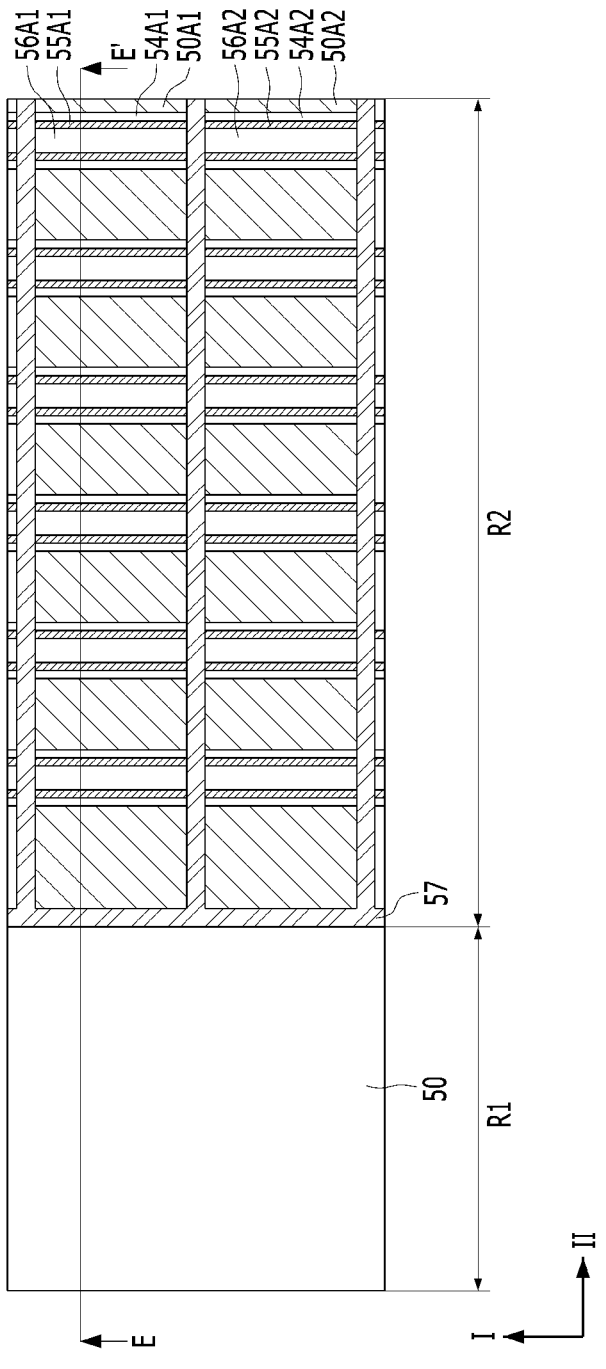
Figure 6B:
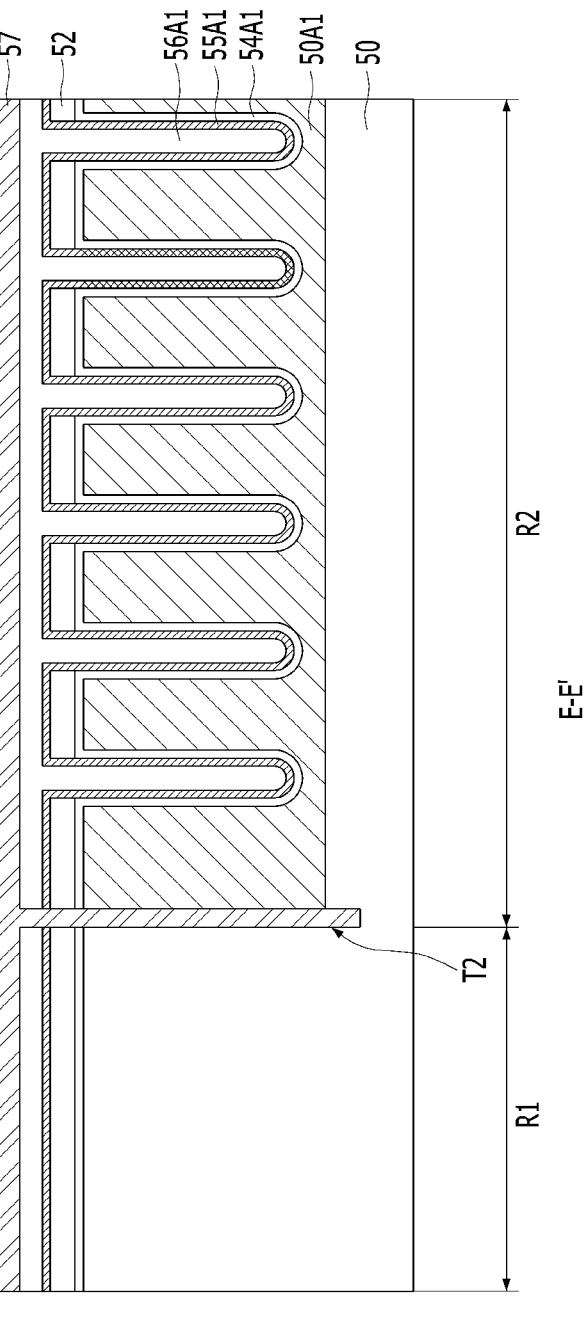

Referring to FIGS. 6A and 6B, a second trench T2 may be formed. The second trench T2 may be used to isolate the block word line 50A in units of memory blocks. The second trench T2 may be located at a boundary between the first region R1 and the second region R2. The second trench T2 may be located in a block word line BWL and may extend along a boundary between memory blocks. The second trench T2 may have a greater depth than the block word line 50A. Through this, the block word line 50A may be isolated into a first block word line 50A1 corresponding to a first memory block and a second block word line 50A2 corresponding to a second memory block.

Subsequently, an isolation insulating layer 57 may be formed in the second trench T2. The isolation insulating layer 57 may fill the second trench T2 and may be formed on the insulating core layer 56. The isolation insulating layer 57 may include an insulating material such as oxide, nitride, or air gap. The memory block may be a unit in which an erase operation is performed.

The insulating core layer 56, the channel layer 55, the pad layer 52, and the gate insulating layer 54 may be isolated in units of memory blocks by the isolation insulating layer 57. The insulating core layer 56 may be isolated into a first insulating core 56A1 corresponding to the first memory block and a second insulating core 56A2 corresponding to the second memory block. The channel layer 55 may be isolated into a first channel layer 55A1 corresponding to the first memory block and a second channel layer 55A2 corresponding to the second memory block. The gate insulating layer 54 may be isolated into a first gate insulating layer 54A1 corresponding to the first memory block and a second gate insulating layer 54A2 corresponding to the second memory block.

Figure 7A:
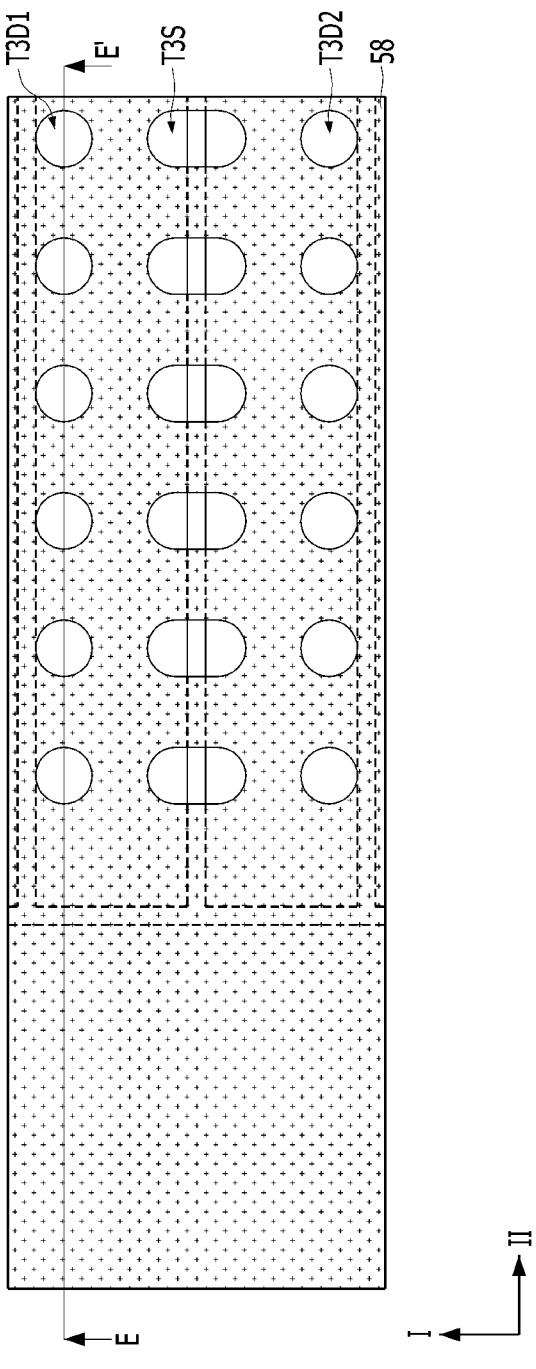
Figure 7B:
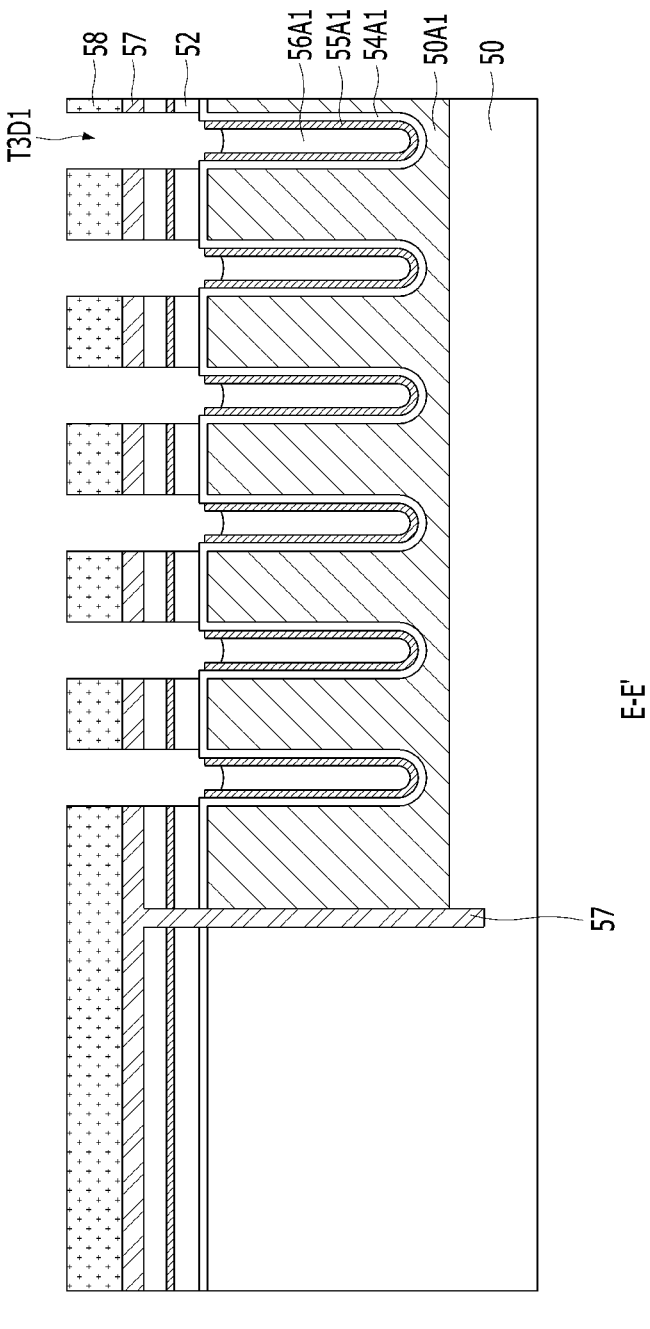

Referring to FIGS. 7A and 7B, third trenches T3S, T3D1, and T3D2 for forming junction pads may be formed. First, a mask pattern 58 may be formed on the isolation insulating layer 57. The mask pattern 58 may include openings exposing locations where junction pads are to be formed. The mask pattern 58 may include photoresist. Subsequently, the isolation insulating layer 57, the first insulating core 56A1, the second insulating core 56A2, the first channel layer 55A1, and the second channel layer 55A2 may be etched using the mask pattern 58 as an etching barrier. Through this, the third trenches T3S, T3D1, and T3D2 may be formed.

The third trench T3S may be used to form a source pad and may commonly expose the first block word line 50A1 and the second block word line 50A2. The third trench T3S may extend in the first direction I, and the isolation insulating layer 57 may be exposed between the first block word line 50A1 and the second block word line 50A2 through the third trench T3S. The third trench T3D1 may be used to form a first drain pad and may expose the first channel layer 55A1. The third trench T3D2 may be used to form a second drain pad and may expose the second channel layer 55A2. Subsequently, the mask pattern 58 may be removed.

Figure 8A:
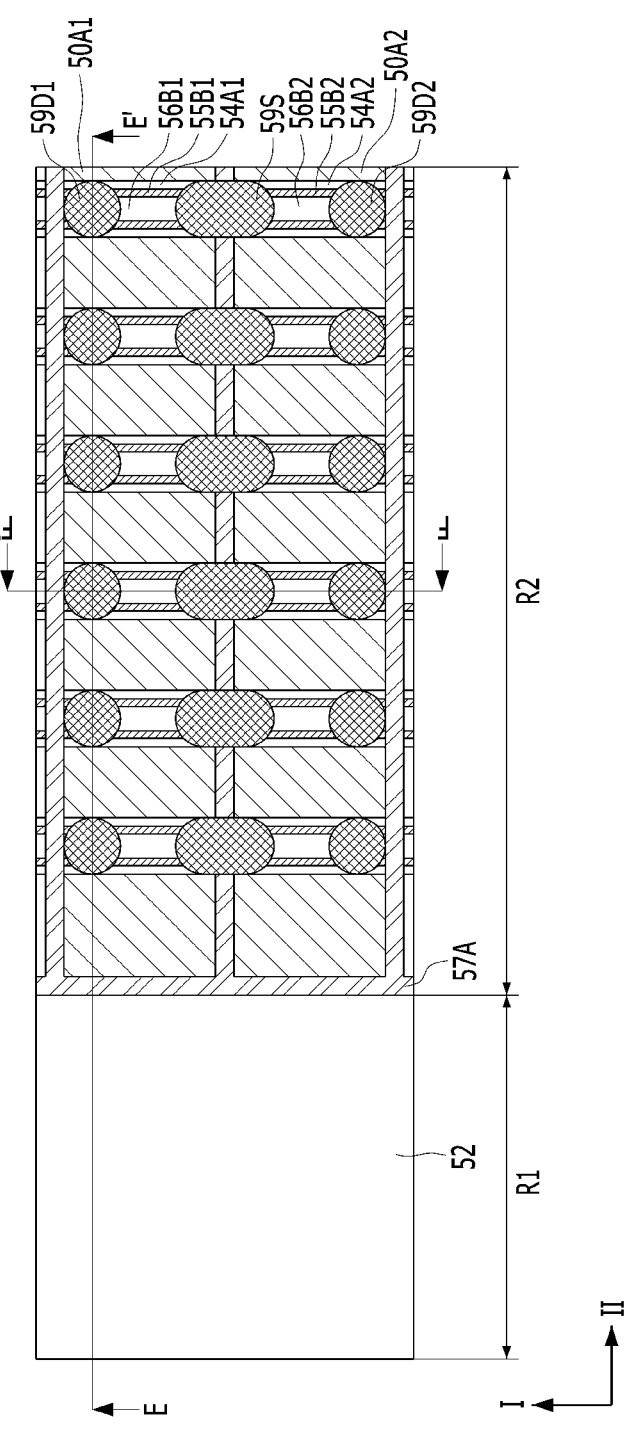
Figure 8B:
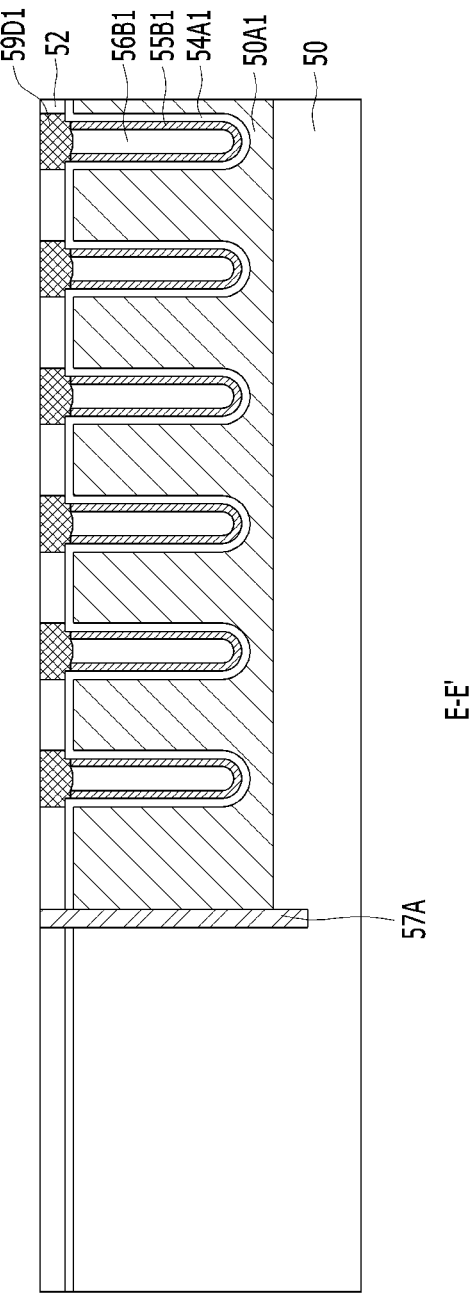

Referring to FIGS. 8A and 8B, junction pads may be formed in the third trenches T3S, T3D1, and T3D2, respectively. The junction pad may include a source pad 59S, a first drain pad 59D1, or a second drain pad 59D2, or a combination thereof.

As an example, a conductive layer may be formed to fill the third trenches T3S, T3D1, and T3D2, and then may be planarized to expose the pad layer 52, so that the junction pads 59S, 59D1, and 59D2 may be formed. The planarization process may be performed in a chemical mechanical polish (CMP) method. During the planarization process, the pad layer 52 may be used as a stop layer. The conductive layer may include a conductive material such as polysilicon or metal. Through this, the source pad 59S may be formed in the third trench T3S, the first drain pad 59D1 may be formed in the third trench T3D1, and the second drain pad 59D2 may be formed in the third trench T3D2.

A portion of the isolation insulating layer 57 formed on the pad layer 52 may be removed by the planarization process. Through this, an isolation structure 57A may be formed to isolate the substrate 50 of the first region R1 from the second region R2 and isolate the first block word line BWL1 from the second block word line BWL2.

The first channel layer 55A1, the first insulating core 56A1, the second channel layer 55A2, and the second insulating core 56A2 may be isolated in transistor units by the planarization process. The first channel layer 55A1 may be isolated into first channel layers 55B1, and the first insulating core 56A1 may be isolated into first insulating cores 56B1. The second channel layer 55A2 may be isolated into second channel layers 55B2, and the second insulating core 56A2 may be isolated into second insulating cores 56B2.

A portion of the first channel layer 55A1 formed on the pad layer 52 may be removed by the planarization process. Through this, the first channel layers 55B1 having a U shape and isolated from each other may be formed. A portion of the second channel layer 55A2 formed on the pad layer 52 may be removed by the planarization process. Through this, the second channel layers 55B2 having a U shape and isolated from each other may be formed.

A portion of the first insulating core 56A1 formed on the pad layer 52 may be removed by the planarization process. Through this, the first insulating cores 56B1 respectively located in the first channel layers 55B1 having a U-shape may be formed. A portion of the second insulating core 56A2 formed on the pad layer 52 may be removed by the planarization process. Through this, the second insulating cores 56B2 respectively located in the second channel layers 55B2 having a U-shape may be formed.

Figure 9A:
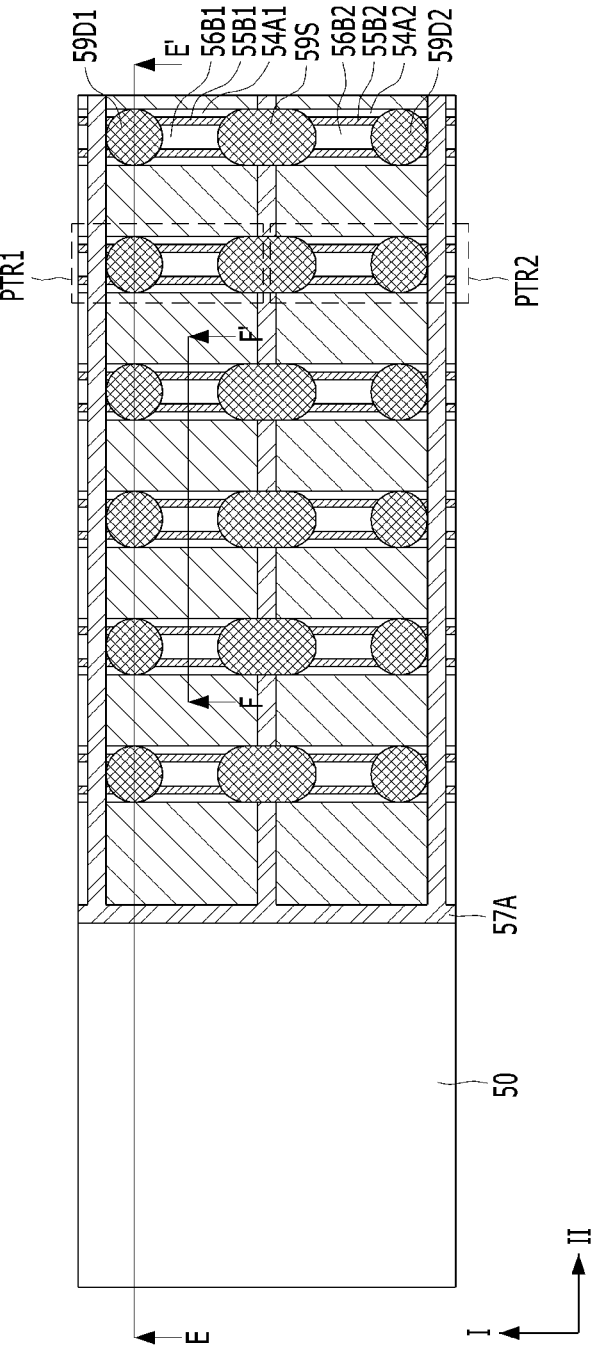
Figure 9B:
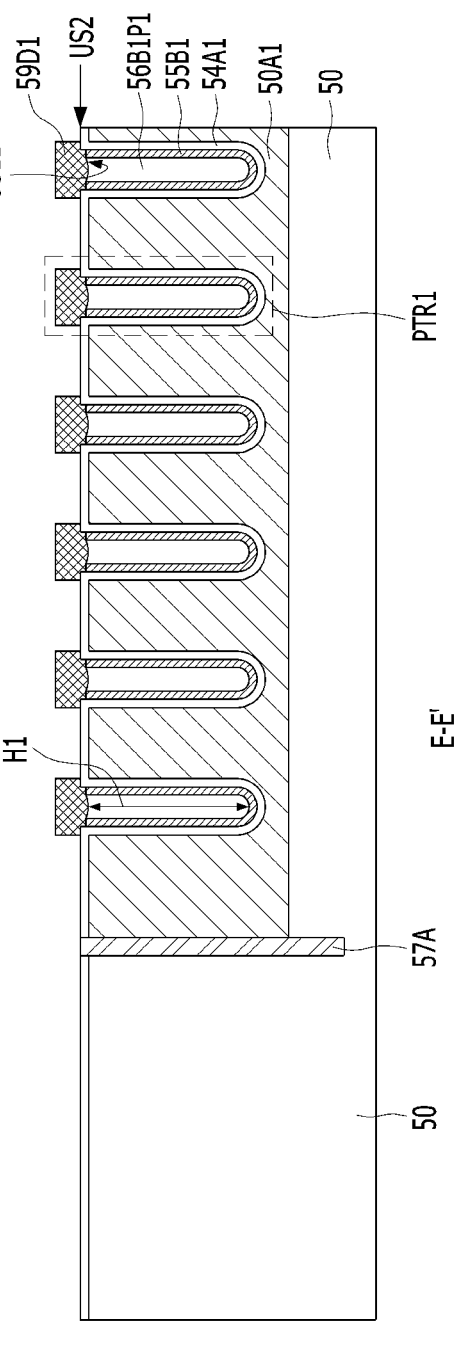
Figure 9C:
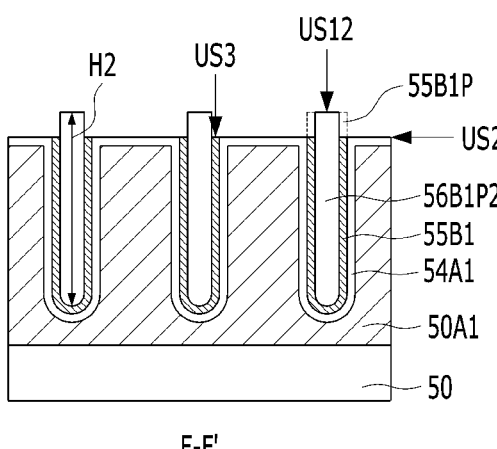

Referring to FIGS. 9A to 9C, the pad layer 52 may be removed. Through this, sidewalls of the source pad 59S, the first drain pad 59D1, and the second drain pad 59D2 may be exposed. The first gate insulating layer 54A1 may be exposed between the source pad 59S and the first drain pad 59D1, and the second gate insulating layer 54A2 may be exposed between the source pad 59S and the second drain pad 59D2.

Between the source pad 59S and the first drain pad 59D1 and between the source pad 59S and the second drain pad 59D2, the first insulating core 56B1, the second insulating core 56B2, the first channel layer 55B1, and the second channel layer 55B2 may be exposed.

The first insulating core 56B1 may include a first portion 56B1P1 overlapping the source pad 59S and the first drain pad 59D1. The first insulating core 56B1 may include a second portion 56B1P2 exposed between the source pad 59S and the first drain pad 59D1. The first portion 56B1P1 may be located in the first channel layer 55B1, and an upper surface US11 of the first portion 56B1P1 may be located at a lower level than an upper surface US2 of the first gate insulating layer 54A1. An upper surface US12 of the second portion 56B1P2 may be located at a higher level than the upper surface US2 of the first gate insulating layer 54A1. In an embodiment, a height H1 of the first portion 56B1P1 of the first insulating core 56B1 overlapping the source pad 59S and the first drain pad 59D1 and a height H2 of the second portion 56B1P2 of the first insulating core 56B1 exposed between the source pad 59S and the first drain pad 59D1 may be different. The second height H2 may be greater than the height H1.

The first channel layer 55B1 may surround sidewalls and a bottom surface of the first insulating core 56B1. An upper surface US3 of the first channel layer 55B1 surrounding the second portion 56B1P2 may be located at substantially the same level as or at a different level from the upper surface US12. As an example, the first channel layer 55B1 exposed by removing the pad layer 52 may be selectively etched. Through this, in an embodiment, leakage current due to a parasitic channel may be reduced.

As a result, first pass transistors PTR1 and second pass transistors PTR2 may be formed. The first pass transistor PTR1 may include the first channel layer 55B1 having a U shape, and the second pass transistor PTR2 may include the second channel layer 55B2 having a U shape. The first pass transistor PTR1 and the second pass transistor PTR2 may share the source pad 59S.

Figure 10:
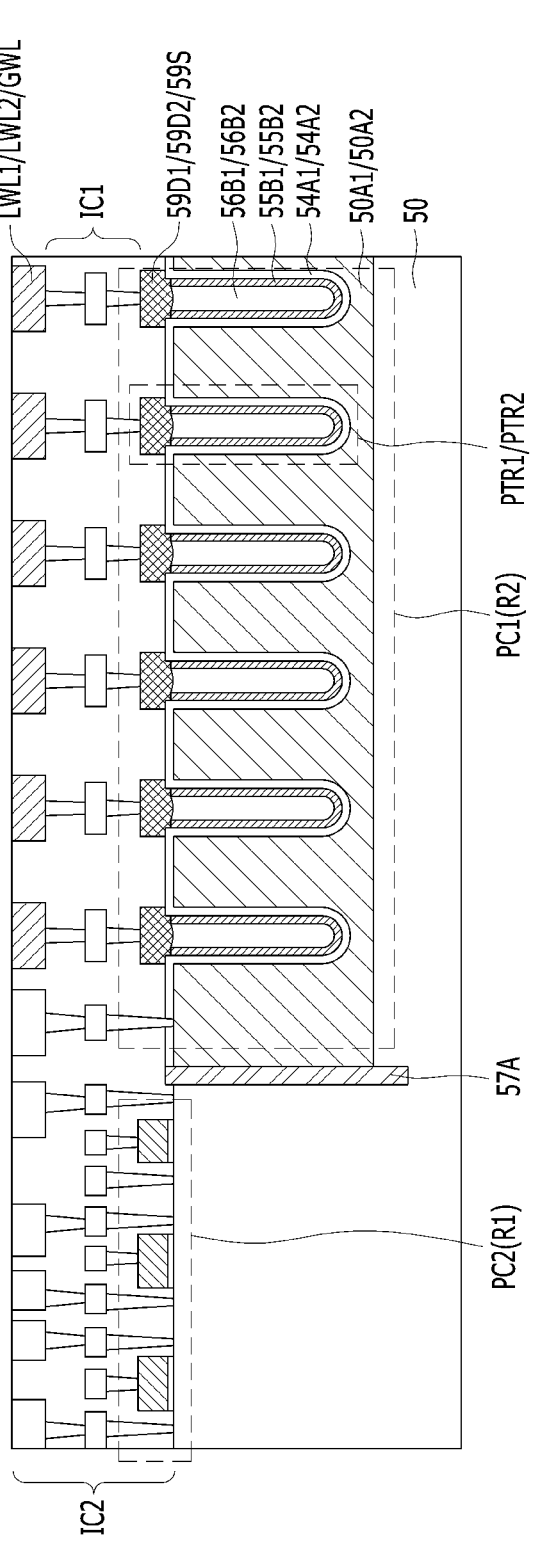

Referring to FIG. 10, a first peripheral circuit PC1, a second peripheral circuit PC2, a first interconnection structure IC1, a second interconnection structure IC2, a first local word line LWL1, a second local word lines LWL2, and a global word line GWL may be formed, or a combination thereof may be formed.

The first peripheral circuit PC1 may include a low-decoder, and may include the first pass transistor PTR1 and the second pass transistor PTR2. The second peripheral circuit PC2 may include a page buffer. The page buffer includes a transistor having a small length and a small width due to the characteristics of its operation. When a transistor including a channel layer having a U shape is applied to the page buffer, an area occupied by the page buffer may be increased. Thus, the page buffer may include a planar transistor.

The first interconnection structure IC1 connected to the pass transistors PTR1 and PTR2 of the first peripheral circuit PC1 may be formed. The second interconnection structure IC2 connected to the second peripheral circuit PC2 may be formed. The first interconnection structure IC1 and the second interconnection structure IC2 may be formed simultaneously or formed in separate processes. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

The global word line GWL electrically connected to the source pad 59S may be formed through the first interconnection structure IC1. The first local word line LWL1 electrically connected to the first drain pad 59D1 through the first interconnection structure IC1 may be formed. The second local word line LWL2 electrically connected to the second drain pad 59D2 through the first interconnection structure IC1 may be formed.

Figure 11:
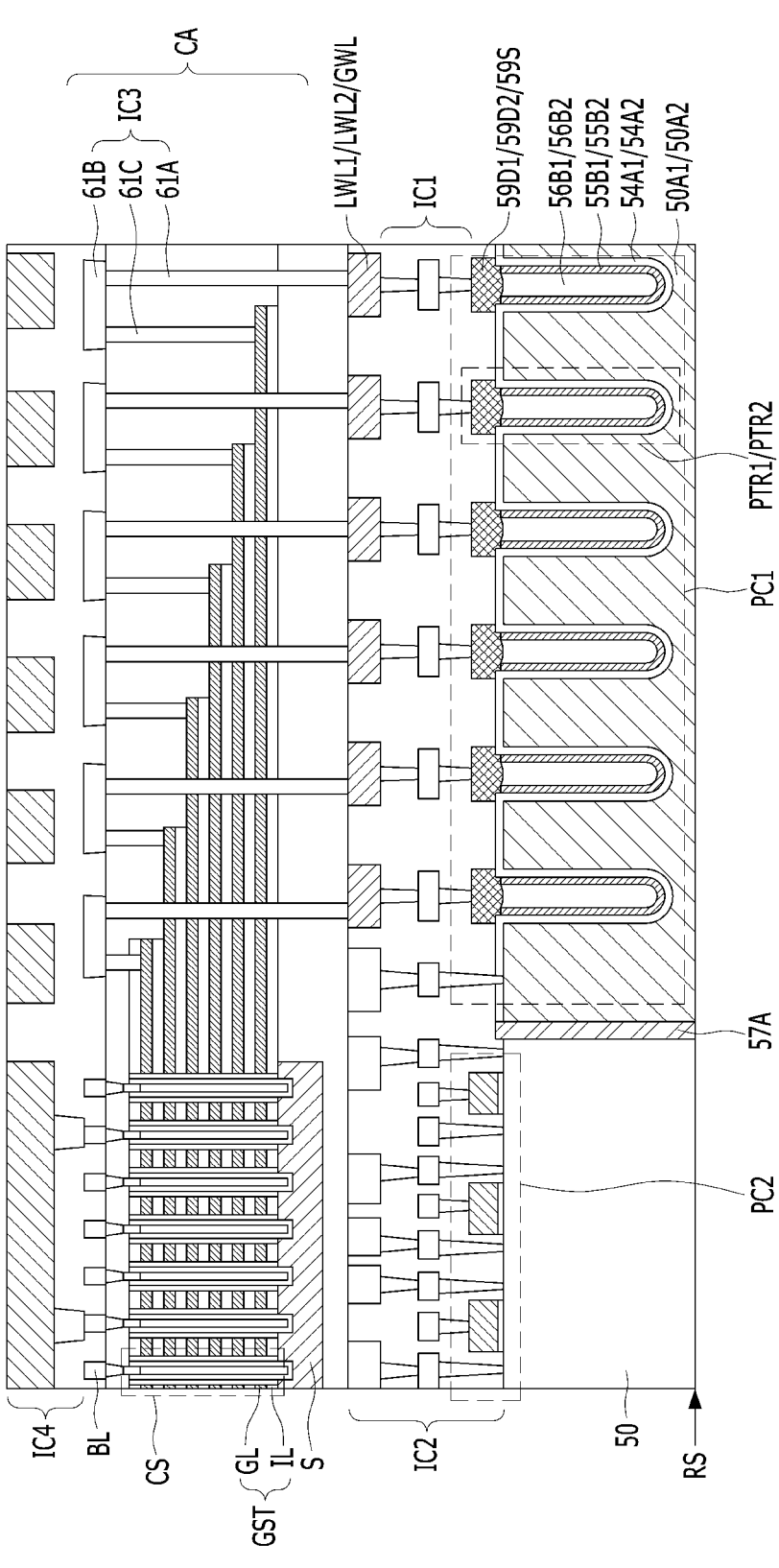

Referring to FIG. 11, a cell array CA may be formed. A source structure S, bit lines BL, a gate structure GST, and cell structures CS may be formed. The gate structure GST may include gate lines GL and insulating layers IL that are alternately stacked.

A third interconnection structure IC3 may be formed. The third interconnection structure IC3 may include a first contact plug 61A, and may further include at least one of a second contact plug 61C and a wire line 61B. The first contact plug 61A may be electrically connected to the first local word line LWL1 or the second local word line LWL2. As an example, the first contact plug 61A may extend through the gate structure GST. The second contact plug 61C may be connected to each of the gate lines GL. The wiring line 61B may connect the first contact plug 61A and the second contact plug 61C to each other. Accordingly, the gate lines GL and the local word lines LWL1 and LWL2 may be connected to each other through the third interconnection structure IC3. The first contact plug 61A may directly connect the gate line GL and the local word lines LWL1 and LWL2 without the second contact plug 61C and the wire line 61B.

A fourth interconnection structure IC4 may be formed. The fourth interconnection structure IC4 may be connected to the bit lines BL. As an example, the fourth interconnection structure IC4 may include a metal wire line including aluminum. Subsequently, a passivation process may be performed.

Subsequently, a rear surface RS of the substrate 50 may be ground. The rear surface of the substrate 50 may be planarized to expose the first block word line 50A1 and the second block word line 50A2. Through this, the first block word line 50A1 and the second block word line 50A2 may be isolated from each other.

According to the manufacturing method described above, the pass transistors PTR1 and PTR2 respectively including the channel layers 55B1 and 55B2 each having a U shape can be formed. Accordingly, cell current of the pass transistor can be increased, and areas occupied by the pass transistors PTR1 and PTR2 can be reduced. The first peripheral circuit PC1 and the second peripheral circuit PC2 can be formed with different types of transistors. In an embodiment, by selecting different types of transistors according to circuit characteristics, areas occupied by the peripheral circuits PC1 and PC2 can be reduced.

In an embodiment, a method of forming the cell array CA on the first peripheral circuit PC1 and the second peripheral circuit PC2 has been described; however, the present disclosure is not limited thereto. The first wafer including the first peripheral circuit PC1 and the second peripheral circuit PC2 may be formed, the second wafer including the cell array CA may be formed, and the first wafer and the second wafer may be bonded to each other. In such a case, after the first wafer and the second wafer are bonded to each other, the rear surface of a substrate may be ground.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor device comprising:
a first block word line;
a first channel layer located in the first block word line;
a source pad connected to the first channel layer and located on the first block word line;
a first drain pad connected to the first channel layer and located on the first block word line;
a global word line connected to the source pad; and
a first local word line connected to the first drain pad,
wherein the first channel layer has substantially a U-shaped cross section, and
wherein the source pad and the first drain pad are on the same side of the first block word line.

2. The semiconductor device of claim 1, wherein the first block word line includes a trench extending in a first direction, and the first channel layer extends in the first direction along an inner surface of the trench.

3. The semiconductor device of claim 1, further comprising: an insulating core located in the first channel layer, and including a first portion overlapping the source pad and the first drain pad and a second portion exposed between the source pad and the first drain pad, a height of the first portion being different from a height of the second portion.

4. The semiconductor device of claim 3, wherein the second portion protrudes from an upper surface of the first channel layer.

5. The semiconductor device of claim 1, wherein the first channel layer extends in a first direction, and the global word line extends in a second direction intersecting the first direction.

6. The semiconductor device of claim 1, further comprising:
gate lines stacked on the first block word line; and
a contact plug extending through the gate lines and electrically connected to the first local word line.

7. The semiconductor device of claim 6, wherein the first local word line is electrically connected to a gate line through the contact plug.

8. The semiconductor device of claim 1, further comprising:
a second block word line;
a second channel layer located in the second block word line;
a second drain pad connected to the second channel layer and located on the second block word line; and
a second local word line connected to the second drain pad.

9. The semiconductor device of claim 8, wherein the source pad is commonly connected to the first channel layer and the second channel layer.

10. A semiconductor device comprising:
a gate structure including stacked gate lines;
a block word line located below the gate structure;
a global word line located between the first block word line and the gate structure;
local word lines located between the block word line and the gate structure;
pass transistors connected between the global word line and the local word lines and including a channel layer having substantially a U shape and located in the block word line; and
an interconnection structure connecting the local word lines and the gate lines, respectively, wherein each of the pass transistor comprises:

a source pad connected to the channel layer and located on the block word line; and a first drain pad connected to the channel layer and located on the block word line, wherein the source pad and the first drain pad are on the same side of the block word line.

11. The semiconductor device of claim 10, further comprising:

a cell structures located in the gate structure; and a page buffer located below the cell structures.

12. The semiconductor device of claim 11, wherein the page buffer includes a planar transistor.

13. The semiconductor device of claim 10, wherein the gate structure includes a contact region where each of the gate lines is exposed, and the pass transistor is located below the contact region.

14. The semiconductor device of claim 10, wherein the interconnection structure includes contact plugs extending through the gate structure.

15. The semiconductor device of claim 10, wherein the interconnection structure comprises:

contact plugs connected to the gate lines, respectively; and a bonding pad configured to bond a first wafer including the pass transistor to a second wafer including the gate structure.

* * * * *